United States Patent [19]

Glass et al.

[11] Patent Number: 4,703,996
[45] Date of Patent: Nov. 3, 1987

[54] INTEGRATED OPTICAL DEVICE HAVING INTEGRAL PHOTODETECTOR

[75] Inventors: Alastair M. Glass, Rumson; Anthony M. Johnson, Spotswood, both of N.J.

[73] Assignee: American Telephone and Telegraph Company, AT&T Bell Laboratories, Murray Hill, N.J.

[21] Appl. No.: 643,958

[22] Filed: Aug. 24, 1984

[51] Int. Cl.⁴ .............................................. G02B 6/12
[52] U.S. Cl. ............................. 350/96.11; 350/96.14; 357/2; 357/30
[58] Field of Search ............... 350/96.11, 96.12, 96.14; 357/2, 30

[56] References Cited

U.S. PATENT DOCUMENTS

| 3,952,265 | 4/1976 | Hunsperger | 350/96.11 |
| 4,203,649 | 5/1980 | Velasco et al. | 350/96.11 |
| 4,334,774 | 6/1982 | Glass et al. | 350/96.12 |
| 4,491,626 | 1/1985 | Kawamura et al. | 357/2 |
| 4,553,810 | 11/1985 | Alferness et al. | 350/96.12 |

FOREIGN PATENT DOCUMENTS 0010985  2/1981  Japan ................................ 357/2

Primary Examiner—John Lee
Attorney, Agent, or Firm—Bernard Tiegerman

[57] ABSTRACT

An integrated optical device is disclosed which includes an integral photodetector exhibiting picosecond response times and quantum efficiencies greater than about 30 percent. The photodetector includes a region of substantially amorphous semiconductor material interposed between two electrodes, with the electrode spacing being comparable to the average electron trapping length in the material between the electrodes. Preferably, at least one of the electrodes is a microstrip transmission line.

7 Claims, 2 Drawing Figures

INTEGRATED OPTICAL DEVICE HAVING INTEGRAL PHOTODETECTOR

BACKGROUND OF THE INVENTION

1. Field of the Invention

The invention pertains generally to integrated optical devices.

2. Art Background

Integrated optical devices (IODs) are devices used for processing, e.g., switching or amplitude modulating, optical signals. Optical information handling systems, e.g., optical fiber communications systems, employing IODs, compared to optical and electronic information handling systems employing integrated circuit devices, have the potential to manipulate more information (carried by light beams), more rapidly.

IODs are typically formed in substrates which include electro-optic or acousto-optic materials, such as lithium niobate or lithium tantalate. Such a device includes one or more wavepaths, i.e., light-guiding regions. In the case of IODs fabricated in electro-optic substrates, the wavepaths are formed by, for example, depositing a dopant such as titanium onto the surface of the device substrate in the pattern desired for the wavepaths. The substrate is then heated to diffuse the dopant into the substrate, resulting in the formation of the wavepaths. In the case of an IOD formed in an acousto-optic substrate, a thin surface region of the substrate constitutes the wavepath. Input and output optical signals are communicated by optical transmission media such as optical fibers which are optically coupled to the device wavepath or wavepaths.

Optical signal processing, e.g., switching between wavepaths or signal amplitude modulation (altering signal amplitudes) in an IOD is effected by inducing refractive index changes in a localized region of the device substrate. Such a refractive index change is achieved either through application of a voltage (in the case of an electro-optic substrate) to a localized electrode, or through the transmission of a surface acoustic wave (in the case of an acousto-optic substrate).

Until recently, integral photodetectors, i.e., photodetectors formed in or on IOD substrates, have not been required. However, new optical processing techniques have now been proposed and/or developed in which integral photodetectors are essential. For example, it is now expected that IODs will be operated at much higher speeds than in the past, requiring much greater precision in switching times to avoid unacceptable information losses.

One technique for achieving enhanced switching precision with IODs involves detecting an optical pulse or pulses injected into a wavepath of an IOD indicating when switching is to occur, and applying a switching voltage in response to the optical pulse or pulses. It is expected that the duration of these pulses will be much less than a microsecond, and even smaller than several tens of picoseconds, while their energies will only be about 1 picojoule. The desired detection thus must be done with a highly responsive and sensitive photodetector to achieve the desired precision.

It has also been proposed that amplitude modulation or switching be controlled by an integral photovoltaic detector. (See Yajima et al, "Optical-Optical Guided-Wave Modulator", *Applied Physics Letters*, Vol. 45 (3), Aug. 1, 1984, pp. 214–216.) In Yajima et al, the photovoltaic detector, 0.5 mm in diameter, was fabricated by successively depositing an indium tin oxide electrode, an 80 Angstrom-thick p, a 5000 Angstrom-thick i, and a 200 Angstrom-thick n, amorphous silicon layer. An aluminum electrode was formed on the layers of amorphous silicon. Yajima et al reported this photodetector to have a quantum efficiency of only 4 percent, a value indicating extreme insensitivity compared to crystalline detectors. The authors also attributed a response time of microseconds to the relatively low mobility of electrons in amorphous silicon, and concluded that faster response times could only be achieved by utilizing crystalline silicon with its associated higher electron mobility.

Thus, integrated optical devices having high speed, high sensitivity, integral photodetectors are being sought.

SUMMARY OF THE INVENTION

The invention involves an integrated optical device having an integral photodetector. The photodetector includes two electrodes and an interposed region of substantially amorphous semiconductor material. The spacing between the electrodes is comparable to the average electron trapping length, i.e., the distance an electron travels before undergoing trapping, in the material between the electrodes. Despite the relatively low mobilities of electrons in the substantially amorphous semiconductor material, upon the application of a high electric field the photodetector exhibits both a quantum efficiency higher than about 30 percent and picosecond response times without undergoing dielectric breakdown. The substantially amorphous semiconductor material also exhibits relatively small (compared to crystalline semiconductor materials) dark currents (only a relatively small current is produced under a biasing voltage in the absence of light). The high quantum efficiencies and small dark currents result in a photodetector whose sensitivity and signal-to-noise ratio is comparable to that of crystalline photodetectors.

BRIEF DESCRIPTION OF THE DRAWING

The invention is described with reference to the accompanying drawings wherein.

DETAILED DESCRIPTION

The invention involves an integrated optical device which includes an integral photodetector. In contrast to previous such photodetectors, the photodetector of the present invention readily achieves a quantum efficiency (the number of detected electrons per incident photon) greater than about 30 percent. The photodetector also readily achieves a response time (the time interval in which the electron current produced by the absorption of a light pulse falls to 1/e of the maximum electron current) smaller than about several tens of picoseconds.

Figure 1:
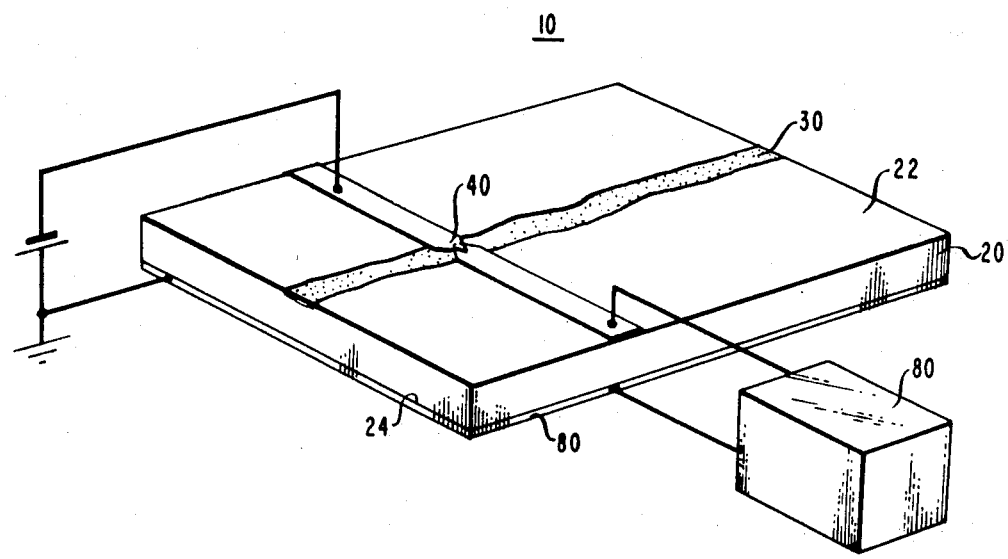
FIG. 1 is a perspective view of one embodiment of the inventive integrated optical device.
Figure 2:
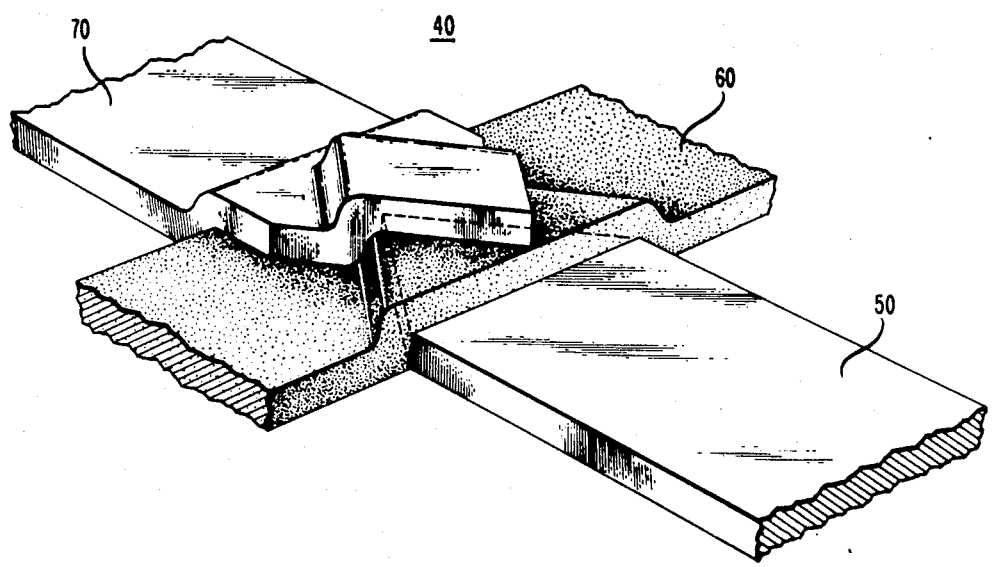
FIG. 2 is a perspective view of the photodetector employed in the inventive integrated optical device.

With reference to FIGS. 1–2, the inventive integrated optical device 10 includes a substrate 20 of, for example, electro-optic material such as lithium niobate or lithium tantalate. The device also includes at least one wavepath 30. The particular type of wavepath is not critical. Exemplary of suitable wavepaths are those formed by depositing (using conventional techniques) a dopant such as titanium onto a top (as viewed in FIG. 1) surface 22 of the substrate 20, and then diffusing the dopant into the substrate. The position of the wavepath is not critical and it is possible, for example, to form it in or on the substrate or on a region contacting the substrate.

The inventive IOD 10 also includes a photodetector 40 formed in or on the substrate 20, e.g., on the surface 22. This detector includes a region of substantially amorphous semiconductor material 60 interposed between two partially overlapping electrodes 50 and 70. (Substantially amorphous semiconductor material, for purposes of the invention, is semiconductor material containing less than about 50 percent crystalline material and, if crystallites are present, their dimensions are smaller than the electrode spacing. An electrode, for purposes of the invention, is an electrically conductive pathway.) The region 60 need not be homogeneous and contains, for example, different substantially amorphous semiconductor materials. The photodetector further includes a ground plane 80 which is, for example, on a bottom (as viewed in FIG. 1) surface 24 of the substrate 20 or, alternatively, on the surface 22. The two electrodes 50 and 70 are, for example, of a metal such as aluminum, and are formed by conventional techniques such as conventional thermal evaporation techniques or conventional rf sputtering techniques. The ground plane 80, if utilized, is a conductive region such as a metal region. This ground plane is formed by conventional techniques such as metal evaporation or sputtering. The region 60 of substantially amorphous semiconductor material is formed, e.g., deposited, using conventional techniques such as conventional rf glow discharge techniques. In operation, light enters the detector 40 through, for example, the electrode 70 (assuming the electrode is at least partially transparent to the light) or through the gap between the electrodes. Alternatively, light enters through the substrate 20 and through the electrode 50. A portion of the light is absorbed by the substantially amorphous semiconductor material, resulting in the formation of electron-hole pairs. The charges are separated by an electric field applied across the electrodes, and collected and transported through one or both of the electrodes, e.g., the electrode 50, to a utilization means 90 which, for example, detects the electron current and responds by applying a voltage through electrodes (not shown) to a region of the substrate 20 to achieve switching or amplitude modulation. Alternatively, the photovoltage produced across the length of, for example, the electrode 50 is communicated directly (through electrodes) to a region of the substrate 20.

The spacing between the electrodes 50 and 70 should be comparable to, or less than, the average electron trapping length, $d_e$, in the material (such as the substantially amorphous semiconductor material) between the electrodes traversed by electrons. (The average electron trapping length is the average distance an excited electron travels before being trapped.) For example, if both electrodes are applied directly to the substantially amorphous semiconductor material, the thickness of the amorphous semiconductor material 60, and thus the spacing between the electrodes 50 and 70, ranges from about 1/10 $d_e$ to about 3 $d_e$. An electrode spacing less than about 1/10 $d_e$ is undesirable because this results in an undesirably large detector capacitance and thus an undesirably large detector response time. On the other hand, electrode spacings larger than about 3 $d_e$ are undesirable because they result in undesirably small detector quantum efficiencies.

The average electron trapping length, $d_e$, which varies with applied electric field and the method used to prepare the material traversed by electrons, is readily determined using conventional techniques (see, e.g., D. H. Auston, P. Lavallard, N. Sol, and D. Kaplan, "An Amorphous Silicon Photodetector For Picosecond Pulses", *Applied Physics Letters*, Vol. 36, p. 66 (1980)). For example, the average electron trapping length in amorphous silicon prepared by rf glow discharge decomposition of silane is about 700 Angstroms for a field of $10^4$ volts/cm (and is thus significantly smaller than the thickness of the amorphous silicon used in the Yajima et al device, discussed above).

Substantially amorphous semiconductor materials exhibit relatively small (as compared to crystalline materials) dark currents (the currents produced under the influence of a biasing voltage but in the absence of light). The relatively small size of the dark currents coupled with the relatively high quantum efficiencies of the present invention, yields a photodetector whose signal-to-noise ratio is comparable to that of crystalline photodetectors.

To achieve a relatively small response time, a correspondingly large field is applied. In addition, at least one of the electrodes, e.g., the electrode 50, is fabricated in the form of, and functions as (by virtue of the presence of the ground plane), a microstrip transmission line. (See, for example, K. C. Gupta, R. Gary, and I. J. Bahl, *Microstrip Lines and Slot Lines* (Artec House, Mass., 1979) for a description of microstrip transmission lines and relevant design considerations.) Moreover, the photodetector 40 is configured so that its RC time constant is smaller than the desired response time.

A suitable field to achieve a desired response time for a given detector configuration and given substantially amorphous semiconductor material is determined by using a control sample. For example, if the amorphous semiconductor material is hydrogenated amorphous silicon prepared by rf glow discharge decomposition of silane, having a thickness of 700 Angstroms, and the desired response time is, for example, 30 picoseconds, then the electric field intensity should be greater than about $3 \times 10^5$ volts/cm. Unlike typical crystalline semiconductor materials, such high fields are readily sustainable in amorphous semiconductor materials, without dielectric breakdown.

The impedance, Z, of the detector 40 is largely that of the microstrip transmission line 50. This impedance depends on the substrate material, the substrate thickness and the width of the transmission line. (In this regard, see Gupta et al, supra.) Generally, to avoid power reflections, the impedance of the microstrip transmission line 50 is matched to that of the utilization means 90. Since the substrate material and thickness are generally constrained by practical considerations of expeditious fabrication, generally the impedance is matched by employing a suitable transmission line width. For example, if the impedance is to be 50 ohms, and if the substrate 20 is a lithium niobate substrate having a thickness of 1 mm, then the width of the microstrip transmission line should be 140 μm.

The capacitance of the photodetector 40 largely depends on the overlap area between the electrodes, and on the composition of the substantially amorphous semiconductor material and its thickness, which in turn is constrained by the electron trapping length requirement. As discussed, the photodetector impedance is determined by matching requirements. Thus, when a microstrip transmission line and a particular amorphous material having a particular thickness are employed, the overlap area is chosen so that a non-limiting RC time constant is achieved. For example, if the desired response time is 30 picoseconds, and if the impedance of the utilization means 90 (and thus of the microstrip transmission line 50) is 50 ohms, then the use of substantially amorphous silicon having a thickness of 1000 Angstroms, arranged between the overlapping electrodes 50 and 70 with an overlap area of 100 $\mu m^2$, yields an RC time constant of 10 picoseconds (which is less than the desired response time).

The electrode 50, if it plays the role of a microstrip transmission line, should be of a material which is electrically conductive, i.e., has a resistivity less than about $10^{-3}$ ohm-cm. Such materials include indium tin oxide as well as metals such as aluminum, or gold, or silver. The thickness of the electrode 50 ranges from about 100 Angstroms to about 3 $\mu m$. A thickness less than about 100 Angstroms is undesirable because the resistance of the transmission line becomes undesirably large, while a thickness greater than about 3 $\mu m$ is undesirable because fabrication, e.g., deposition, times becomes undesirably long. The width of the electrode 50, as noted above, is determined by impedance matching requirements.

If the electrode 70 is used only to apply a biasing voltage (and is not formed in a transmission line configuration), then the electrode 70 need not be of a material which is as electrically conductive as the material of the electrode 50. However, the resistivity and dimensions of the electrode 70 should produce a resistance such that the detector RC time constant is less than the desired response time.

While not essential to the invention, the material of the electrode 70, and/or that of the microstrip transmission line 50, preferably forms a Schottky barrier with the substantially amorphous semiconductor material 60. The Schottky barrier or barriers (when reverse biased) largely prevent the injection of electrons into the substantially amorphous semiconductor material from the electrode 70 and/or electrode 50. Thus, the introduction of electrons not related to the incident light is largely prevented. Useful Schottky barrier-forming materials on, for example, hydrogenated amorphous silicon include materials such as chromium and platinum.

If the light to be detected by the photodetector 40 enters the detector through the electrode 70, then the electrode should transmit at least 20 percent of the incident light to achieve a readily detectable signal. If the electrode 70 is, for example, of gold, then such a transmissivity, for incident light having a wavelength of, for example, 0.62 $\mu m$, is readily achieved provided the thickness of the electrode 70 is less than about 80 Angstroms.

The substantially amorphous semiconductor material 60 is chosen to have a bandgap smaller than, or equal to, the energy of the incident light (which thus allows absorption of the light). For example, if the light to be detected is visible light having a wavelength of 0.6 $\mu m$, then a useful, substantially amorphous semiconductor material is, for example, hydrogenated or non-hydrogenated, substantially amorphous silicon. On the other hand, if the light to be detected is infrared light having a wavelength of 1.3 $\mu m$, then a useful, substantially amorphous semiconductor material is, for example, hydrogenated or non-hydrogenated, substantially amorphous germanium.

In place of, or in combination with, the Schottky barrier or barriers, two adjacent regions of the semiconductor material 60 are preferably doped with p and n dopants to form a p-n junction. Such a junction also prevents the introduction of electrons not related to the incident light.

While not essential to the invention, one (or more) of the surfaces of the photodetector 40 is preferably a bumpy surface which is substantially periodic, to more effectively couple incident light into the detector. Techniques for fabricating such a bumpy surface, as well as the relationship between the periodicity of the bumpy surface and the wavelength of light coupled into the detector, are described in coassigned U.S. Pat. No. 4,555,622 issued to A. M. Glass, A. M. Johnson and P. F. Liao on Nov. 26, 1985, which is hereby incorporated by reference.

In one embodiment of the inventive IOD 10, where the purpose of the photodetector 40 is to detect light traversing the wavepath 30, the photodetector is fabricated so it straddles (see FIG. 1) the wavepath 30. Consequently, the light (or a portion of the light) traversing the wavepath is necessarily absorbed by the detector, resulting in the desired detection. Alternatively, the photodetector 40 is positioned adjacent (but not straddling) the wavepath 30 and detection is achieved by detecting the evanescent optical field surrounding the light traversing the wavepath 30.

In another embodiment of the IOD 10, where the purpose of the photodetector 40 is to detect light from a light source, e.g., a laser, positioned on or at some distance from the substance 20, the photodetector is positioned relative to the light source so that at least a portion of the light impinges the photodetector. (Because the photodetector is not detecting the light in the wavepath 30, it neither straddles the wavepath, nor need it even be located adjacent the wavepath.) Here, the photocurrent generated by the photodetector (in response to the light from the light source) is communicated, for example, to a utilization means 90 which responsively applies a voltage across the wavepath 30, i.e., to a substrate region adjacent, e.g., underlying, the wavepath, through electrodes (not shown in FIG. 1) formed on opposite sides of the wavepath. A useful configuration for these electrodes is described by, for example, R. C. Alferness et al in "High-Speed Traveling-Wave Directional Coupler Switch/Modulator for $\lambda = 1.32$ $\mu m$," *IEEE Journal of Quantum Electronics*, Vol. QE-19, No. 9, September 1983, pp. 1339–1341. Alternatively, the photovoltage produced across the length of the microstrip transmission line 50 is communicated directly to the electrodes on opposite sides of the wavepath.

EXAMPLE 1

The photodetector of the present invention was formed on a square, lithium niobate substrate having a length and width of one inch and a thickness of 1 mm. Initially, a grounded plane was fabricated by thermally evaporating a layer of aluminum onto the bottom surface of the substrate. The aluminum had a thickness of approximately 1000 Angstroms.

A bottom aluminum electrode, which functioned as a microstrip transmission line, was formed on the top surface of the lithium niobate substrate using conventional photolithographic and thermal evaporation techniques. The microstrip transmission line extended from the center of the top surface to a first edge of the top surface, and had a length of one-half inch. The parallel sides of the microstrip transmission line converged to a point at the center of the top surface, forming an angle of 90 degrees. The thickness of the microstrip transmission line was 500 Angstroms, and the width was 140 μm.

A strip of hydrogenated, amorphous silicon, 1000 Angstroms thick and 5 mm wide, was deposited onto the top surface of the lithium niobate substrate, at a right angle to, and covering the pointed end of, the microstrip transmission line. This was achieved by placing the lithium niobate substrate on the grounded electrode of a parallel-plate, evacuated, rf glow discharge machine. While maintaining the atmosphere within the glow discharge machine at a pressure of 0.36 torr, (100 percent, undoped) silane was flowed into the glow discharge machine at a flow rate of 50 sccm, while a 13.56 MHz signal was applied to the power electrode of the machine. The applied power was 5 watts while the spacing between the grounded and power electrodes of the glow discharge machine was 15 mm.

A top, semi-transparent electrode, consisting of successive layers of chromium and gold, was then formed on the top surface of the lithium niobate substrate using conventional photolithographic and thermal evaporation techniques. The thicknesses of the chromium and gold were, respectively, 20 Angstroms and 50 Angstroms. The width of the electrode was 140 μm. The top electrode extended from the center of the top surface, at a right angle to the amorphous silicon stripe, to a second edge (parallel to the first edge, referred to above) of the top surface, and thus had a length of one-half inch. Like the microstrip transmission line, the parallel sides of the electrode also converged to a point at the center of the top surface, forming an angle of 90 degrees. The pointed end of the top electrode overlapped both the amorphous silicon and the pointed end of the microstrip transmission line, the overlap area being 100 μm$^2$.

The microstrip transmission line was connected to a sampling oscilloscope, while the top electrode was connected to the negative terminal of a 4 volt source, using SMA electrical connectors purchased from the Omni Spectra Company. The impedance of the oscilloscope was known to be 50 ohms, and its response time was known to be 30 picoseconds.

The dark current (the current in the amorphous silicon in the absence of light), under the influence of the biasing 4 volts, was measured to be 4.2 nanoamps.

A modelocked dye laser, operating at a wavelength of 6200 Angstroms, was then used to direct a train of optical pulses, at a repetition rate of $10^8$/second, onto the photodetector. The energy of each pulse was 0.64 picojoules, while the duration of each pulse was 0.3 picoseconds. The peak voltage measured on the oscilloscope (the voltage drop produced by the photocurrent flowing across the 50 ohm impedance of the oscilloscope) was 11.2 mV. The response time (full width at half maximum) was 85 picoseconds.

Correcting only for loss due to reflectivity, the quantum efficiency of the photodetector was measured to be 14 percent.

EXAMPLE 2

The microstrip transmission line of the photodetector of Example 1 was connected to the sampling oscilloscope of Example 1, while the top electrode was connected to the negative terminal of a 10 volt source. This time, the dark current was measured to be 0.67 μ-amps.

The optical pulses described in Example 1 were then directed onto the photodetector. The resulting peak (oscilloscope) voltage was 60 mV, while the (full width at half maximum) response time was 40 picoseconds.

Employing the technique referred to in Example 1, the quantum efficiency of the photodetector was measured to be 36 percent.

What is claimed is:

1. An integrated optical device, comprising:
   a substrate;
   an optical wavepath in said substrate; and
   a photodetector positioned such that electromagnetic radiation traversing or emanating from said wavepath is at least partially absorbed in said photodetector, said photodetector including a region of substantially amorphous semiconductor material interposed between two electrodes, wherein a spacing between said electrodes ranges from about 1/10 $d_e$ to about 3 $d_e$, where $d_e$ denotes the average electron trapping length in the material between the electrodes, and wherein said region exhibits a resistance, in the absence of electromagnetic radiation and at a room temperature of 23 degrees Centigrade, greater than about $10^7$ ohms.

2. The device of claim 1 wherein at least one of said electrodes is a microstrip transmission line.

3. The device of claim 1 further comprising means, responsive to an electrical signal produced by said photodetector, for applying a voltage to a region of said substrate.

4. The device of claim 1 wherein said substrate includes electro-optic material.

5. The device of claim 4 wherein said electro-optic material includes lithium niobate.

6. An integrated optical device, comprising:
   a substrate;
   an optical wavepath in said substrate;
   a photodetector which includes a region of substantially amorphous semiconductor material interposed between two electrodes; and
   means, responsive to said photodetector, for applying a voltage to a region of said substrate adjacent a portion of said wavepath, wherein a spacing between said electrodes ranges from about 1/10 $d_e$ to about 3 $d_e$, where $d_e$ denotes the average electron trapping length in the material between the electrodes, and wherein said region of substantially amorphous semiconductor material exhibits a resistance, in the absence of electromagnetic radiation and at a room temperature of 23 degrees Centigrade, greater than $10^7$ ohms.

7. The device of claim 6 wherein at least one of said electrodes is a microstrip transmission line.

* * * * *

UNITED STATES PATENT AND TRADEMARK OFFICE
CERTIFICATE OF CORRECTION

PATENT NO. : 4,703,996

DATED : November 3, 1987

INVENTOR(S) : Alastair M. Glass, Anthony M. Johnson

It is certified that error appears in the above-identified patent and that said Letters Patent is hereby corrected as shown below:

Column 6, line 12, "effectively" should be --efficiently--.

Signed and Sealed this

Twenty-ninth Day of May, 1990

Attest:

HARRY F. MANBECK, JR.

Attesting Officer        Commissioner of Patents and Trademarks